United States Patent [19]
Hoshi

[11] Patent Number: 4,617,647
[45] Date of Patent: Oct. 14, 1986

[54] MEMORY CIRCUIT

[75] Inventor: Katsuji Hoshi, Tokyo, Japan

[73] Assignee: NEC Corporation, Tokyo, Japan

[21] Appl. No.: 561,371

[22] Filed: Dec. 14, 1983

[30] Foreign Application Priority Data

Dec. 14, 1982 [JP] Japan ................................ 57-218683

[51] Int. Cl.⁴ .............................................. G11C 7/00
[52] U.S. Cl. .................................... 365/189; 365/233
[58] Field of Search ................ 365/189, 193, 230, 233

[56] References Cited

U.S. PATENT DOCUMENTS 4,397,001 8/1983 Takemae ........................... 365/189

Primary Examiner—Joseph A. Popek
Attorney, Agent, or Firm—Sughrue, Mion, Zinn, Macpeak and Seas

[57] ABSTRACT

A memory circuit which can perform a write operation at a high-speed is disclosed. The memory circuit has an input circuit receiving an external read-write signal which has a direct connection to a terminal receiving a chip control signal such as a column address strobe signal and is adapted to be directly controlled by the chip control signal itself.

8 Claims, 5 Drawing Figures

MEMORY CIRCUIT

BACKGROUND OF THE INVENTION

1. Field of the Invention

The present invention relates to memory circuits composed of semiconductor elements and, more particularly, to a memory circuit using field effect transistors.

2. Description of the Prior Art

In a dynamic type random access memory (DRAM) composed of MOS field-effect transistors (MOSTs), the so-called "multi-strobe addressing" technique is frequently used. According to this technique, the DRAM receives row address signals through address input terminals in response to a row address strobe signal ($\overline{RAS}$) and column address signals through the same address input terminals in response to a column address strobe signal ($\overline{CAS}$). The multi-strobe addressing technique is disclosed in detail in U.S. Pat. No. 3,969,706. Such a memory has a row timing signal generator which generates a control signal for controlling a peripheral circuit for the row selection such as a row decoder and controlling a sense amplifier in response to the row address strobe signal, a column timing signal generator which responds to the column address strobe signal and the output from the row timing signal generator to generate a control signal controlling a column decoder, a column selector, a data input-output circuit, and a read-write control signal generator which responds to the column address strobe signal and a read-write signal ($\overline{WE}$) to generate the read-write control signal controlling the data input-output circuit between read and write modes. Since the read-write control signal is generated in response to the column strobe signal, it has been difficult to bring the state of the memory immediately into the write mode even when the read-write signal is turned to a write level designating the write operation, and therefore the speed of the write operation is inevitably slow.

SUMMARY OF THE INVENTION

An object of the present invention is to provide a memory circuit which can conduct high-speed writing with a simple circuit construction.

The memory circuit according to the present invention is featured in that a first-stage input inverter receiving a read-write signal, which comes from the outside, is controlled directly by an external chip control signal such as the address strobe signal (e.g., $\overline{CAS}$) or a chip enable signal.

In the present invention, the output of a first-stage input inverter is directly controlled by a chip control signal (e.g., $\overline{CAS}$) so that the write operation can be conducted without any delay immediately after the chip comes into addressable state.

DESCRIPTION OF THE PRIOR ART

Figure 1:
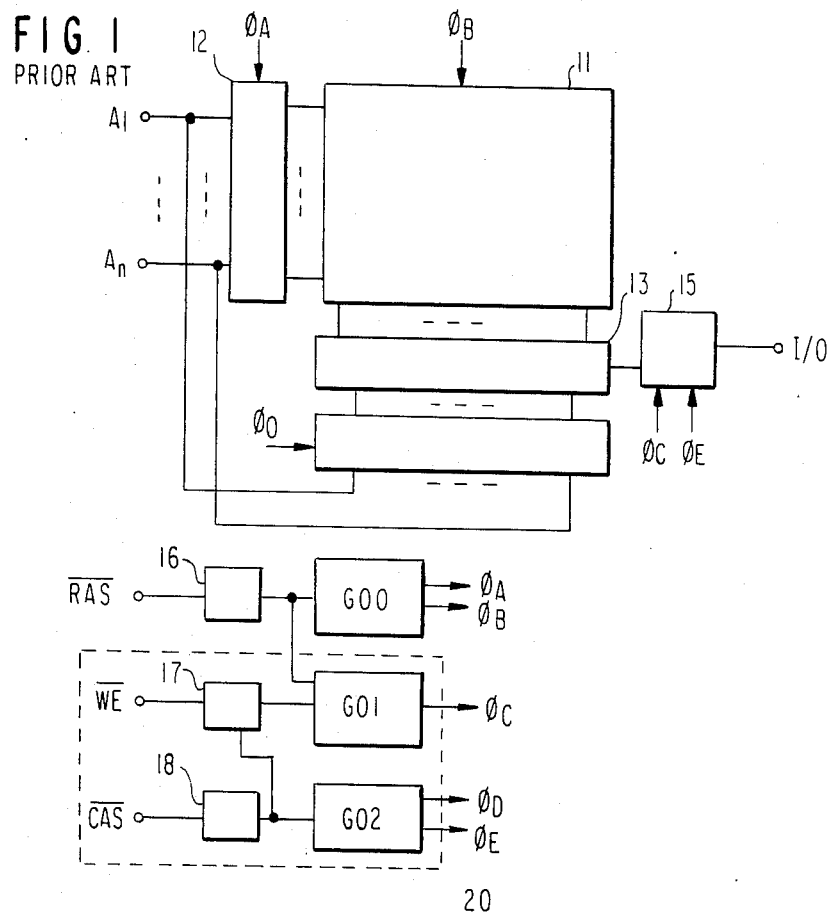
FIG. 1 is a block diagram of a dynamic memory circuit according to the prior art.

A prior-art dynamic memory circuit will be described in the following with reference to FIG. 1.

Address input terminals $A_1$ to $A_n$ are connected to a row address decoder 12 and a column address decoder 14 in common. In response to a row address strobe signal $\overline{RAS}$ incorporated through a buffer 16, a row timing clock generator G00 generates a clock $\phi_A$ for controlling the row decoder 12 and a clock $\phi_B$ for controlling a memory cell array 11.

A column address selection circuit 13 is controlled by the column decoder 14 so as to connect a column line to be accessed of the memory cell array 11 to a data input-output circuit 15. In response to a column strobe signal $\overline{CAS}$ incorporated through a buffer 18, a column clock generator G02 generates a clock $\phi_D$ for controlling the column decoder 14 and a clock $\phi_E$ for controlling the data input-output circuit 15. In response to an external read-write signal $\overline{WE}$ received by a NOR gate 17 which also receives the output of the buffer 18, the write clock generator G02 generates a read-write control signal $\phi_C$ when the column strobe signal is in its active level. This control signal $\phi_C$ controls the input-output circuit 15 between read and write modes.

The construction and operation of a circuit block 20 formed of the buffer 18 which receives the column strobe signal $\overline{CAS}$ and the gate 17 which receives the write control signal $\overline{WE}$ will now be described in detail, with reference to FIGS. 2 and 3.

Figure 2:
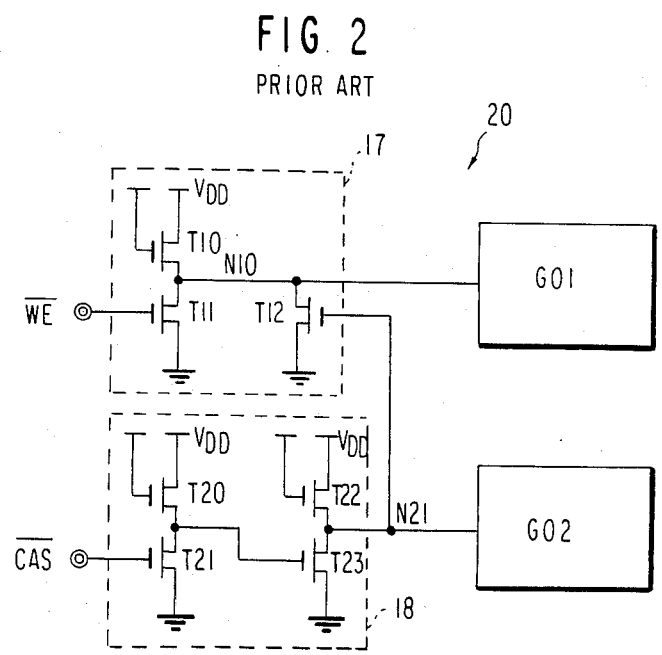
FIG. 2 is a circuit diagram of $\overline{WE}$ signal and the $\overline{CAS}$ signal input circuits and clock generator in the prior art.
Figure 3:
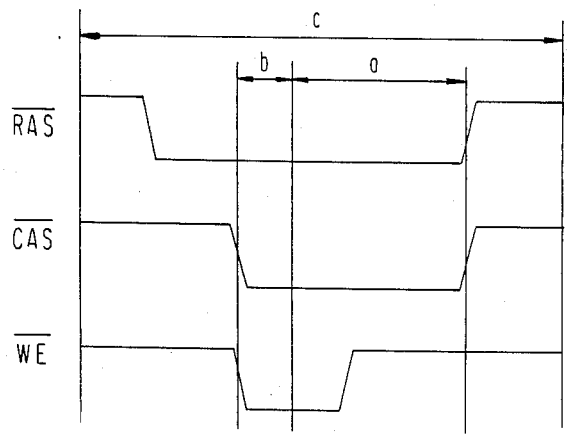
FIG. 3 is a timing chart which serves to illustrate the input timings used by the circuits of FIG. 3.

As shown in FIG. 2, the NOR gate 17 is composed of an enhancement MOST (EMOST) T10 having drain and gate connected to a power voltage $V_{DD}$ and a source connected to a node N10, an EMOST T11 having a drain connected to a node N10, a gate receiving the external signal $\overline{WE}$, and a a source connected to the ground voltage, and an EMOST T12 having a drain connected to the mode N10, a source connected to the ground, and a gate fed with the output of the buffer 18. The buffer 18 is composed of an EMOST T20 having a drain and a gate connected to $V_{DD}$ and a source connected to a node N20, an EMOST T21 having a drain connected to the node N20, a gate receiving the external signal $\overline{CAS}$ and a source connected to the ground, an EMOST T22 having a drain and a gate connected to $V_{DD}$ and a source connected to a node N21, and an EMOST T23 having a drain connected to the node N21, a gate connected to the node N20, and a source connected to the ground.

A write operation called "Early Write" made by the circuit shown in FIG. 2 will be explained, by the timing chart illustrated in FIG. 3.

Row address signals are incorporated through the address input terminals $A_1$ to $A_n$ into the row address decoder 12 (FIG. 1) when the row address strobe signal $\overline{RAS}$ controlling the reception of row address signals falls from a high level voltage sufficiently higher than a threshold voltage (hereinafter abbreviated to "$V_T$") of the EMOST to a low level voltage which is lower than the $V_T$, and then column address signals are taken via the address input terminals into the column decoder 14 when the signal $\overline{CAS}$ falls from the high level to the low level. At this instance if the write signal $\overline{WE}$ is low, external data is input to the bit location selected by the row address and the column address. In Early Write operation in which both the $\overline{CAS}$ and $\overline{WE}$ are simultaneously made fallen from high to low in level, as shown in FIG. 3, the impedance of EMOST T21 receiving the signal $\overline{CAS}$ becomes high (i.e., turned off). Then, the output node N20 of the inverter composed of EMOSTs T20 and T21 becomes high to make the impedance of EMOST T23 low (turned on) so that the potential at the output node N21 of the inverter composed of EMOSTs T22 and T23 becomes low. From this instance, the CAS clock generator G02 is enabled. When the EMOST T11 receiving the low level signal $\overline{WE}$ is turned off, a portential at the output node N10 of the NOR gate 17 composed of EMOSTs T10 and T11 is still low because of EMOST T12 and becomes high only after EMOST T12 is turned off by the output N21 of the buffer 18. Therefore, the timing when the write clock generator G01 is enabled is delayed. Since this input circuit 17 for $\overline{WE}$ controls the start of operation of the write clock generator G01 by the output signal of the CAS buffer 18, a stand-by time b controlling that start by the signal $\overline{CAS}$ is required during the write in addition to an operation-completing time a of the write clock generator G01. As a result, the minimum time required for completing the write is the sum of (a+b). This makes it difficult to conduct the write operation at a high speed.

DESCRIPTION OF THE EMBODIMENT OF THE INVENTION

The circuits controlling the signal generators G01 and G02 according to the embodiment of the present invention will now be described with reference to FIG. 4.

Figure 4:
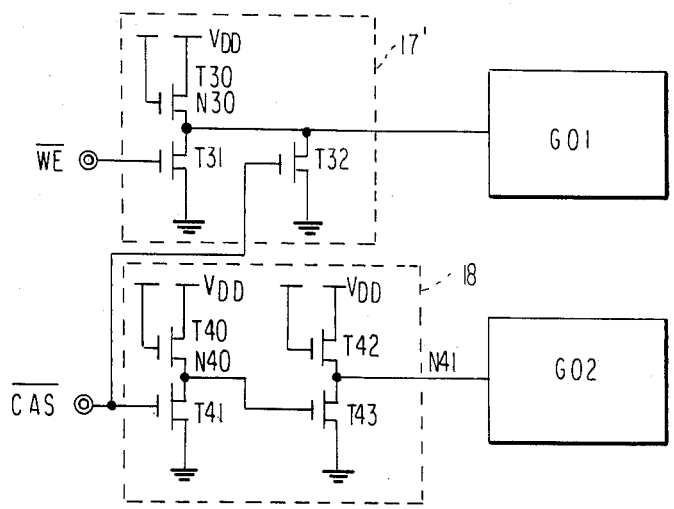
FIG. 4 is a circuit diagram of write clock generators according to one embodiment of the present invention.

In FIG. 4, an input circuit 17' for $\overline{WE}$ is composed of an EMOST T30 having a drain and a gate connected to $V_{DD}$ and a source connected to a node N30, an EMOST T31 having a drain connected to node N30, a gate receiving the external signal $\overline{WE}$, and a source connected to GND, and an EMOST T32 having a drain connected to the node N30, a gate which is directly connected to the terminal receiving the signal $\overline{CAS}$, and a source connected to GND. The buffer 18 is composed of an EMOST T40 having a drain and a gate connected to $V_{DD}$ and a source connected to a node N40, an EMOST T41 having a drain connected to the node N40, a gate receiving the external signal $\overline{CAS}$, and a source connected to GND, an EMOST T42 having a drain and a gate connected to $V_{DD}$ and a source connected to a node $N_{41}$, and an EMOST T43 having a drain connected to the node N41, a gate connected the node N40, and a source connected to GND. Then node N30 is connected to the write clock generator G01, and the node N41 to the CAS clock generator G02.

Figure 5:
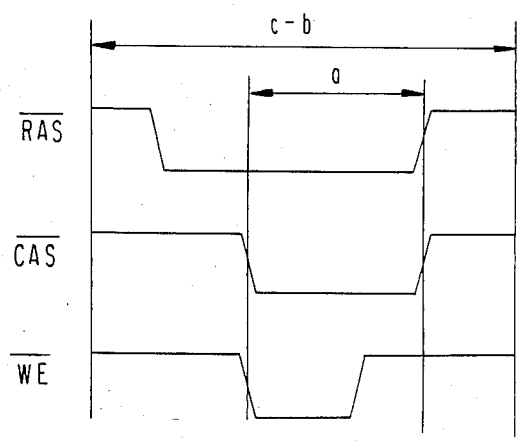
FIG. 5 is a timing chart which serves to illustrate the input timings used by the circuits of FIG. 4.

In an Early Write operation, the signals $\overline{CAS}$ and $\overline{WE}$ are simultaneously made fallen from high to low in level, as shown in FIG. 5. Both EMOST T31 receiving the signal $\overline{WE}$ at its gate and EMOST T32 receiving the signal $\overline{CAS}$ at its gate are turned off simultaneously, so that a potential at the node N30 becomes high immediately without taking the stand-by time b described with reference to FIG. 3. This is due to the direct connection of the gate of EMOST T32 to the $\overline{CAS}$ terminal. As a result, the minimum write-completing time is achieved, which is just the operation-completing time a of the write clock generator G01.

As has been described above, the circuit of FIG. 4 embodying the present invention can execute a write mode cycle in a time not containing the standby time b, when compared with the circuit of FIG. 2 according to the prior art.

As has been described above, according to the present invention, by controlling the output of the first-stage input inverter of an external read-write signal directly by an external chip control signal, the memory circuit can operate with a shorter write mode cycle than the prior art, thereby realizing a high-speed write operation. In a DRAM which can receive addresses in a multiplexed manner and which is adapted to be driven by $\overline{RAS}$ and $\overline{CAS}$ signals, a nibble mode which is conducted by repeating change in level of the $\overline{CAS}$ signal along to sequentially access consecutive columns is required to operate at a speed of at least three times that of a page mode. The present invention is especially effective to the nibble mode because a high-speed write can be realized with ease.

I claim:

1. A memory circuit comprising: a plurality of memory cells arranged in a matrix of rows and columns; a first external terminal for receiving a first external control signal which is externally generated outside the memory circuit, said first external control signal assuming first and second levels; a first control circuit coupled to said first external terminal for generating a first internal signal in response to the second level of said first external signal; a second external terminal for receiving a second external control signal which is externally generated outside the memory circuit, said second external control signal assuming third and fourth levels; selection means for operatively selecting at least one of said memory cells in response to said first internal signal; a read-write circuit for operatively performing one of a read operation and a write operation with respect to the selected at least one memory cell; a second control circuit coupled to said first and second external terminals and including a first transistor having a source-drain path coupled between a control node and a reference voltage and a gate directly connected to said first external terminal, a second transistor having a source-drain path coupled between said control node and said reference voltage and a gate directly connected to said second external terminal, and means for supplying said control node with a power voltage, said control node being approximately at said power voltage when said first external control signal is at said second level and said second external control signal is at said fourth level and otherwise approximately at said reference voltage; and control means coupled to said control node of said second control circuit for operatively setting said read-write circuit in a write node when said control node is approximately at said power voltage and said first internal signal is present and in a read node when said control node is approximately at said reference voltage and said first internal signal is present.

2. The memory circuit according to claim 1, in which said first control circuit includes a plurality of inverters connected in cascade.

3. A semiconductor memory circuit comprising: a plurality of memory cells; a first external terminal for receiving a first external control signal which is externally generated outside the memory circuit; a first control circuit coupled to said first external terminal for generating a first internal control signal in response to said first external signal; selection means for selecting at least one of said memory cells in response to said first internal signal; a second external terminal for receiving a second external control signal which is externally generated outside the memory circuit; a second control circuit coupled to said second external terminal for generating a second internal control signal in response to said second external terminal; a read-write circuit coupled to said selection means for operatively performing either a read operation or a write operation in response to said first and second internal control signals, said read-write circuit performing a write operation for the selected at least one memory cell when both of said first and second internal control signals are present and a read operation for the selected at least one memory cell when said first internal control signal is present and said second internal control signal is not present; and a control transistor having a control electrode directly connected to said first external terminal, said control transistor assuming a conductive state when said first external control signal is not present to thereby inhibit said second control circuit from generating said second internal control signal irrespective of the state of said second external signal and a non-conductive state when said first external signal is present to thereby allow said second control circuit to generate said second internal control signal.

4. The memory circuit according to claim 3, in which said second control circuit includes an input transistor coupled between the output terminal of said second control circuit and a reference voltage and having a control electrode coupled to said second external terminal, and a load transistor coupled between said output terminal and a power voltage, said control transistor being connected in parallel with said input transistor.

5. A memory circuit comprising; a plurality of memory cells arranged in rows and columns, a set of address terminals, a first external terminal for receiving a first external control signal which is externally generated outside the memory circuit, first means responsive to said first external control signal for generating at least one row control signal, second means coupled to said set of address terminals for selecting the rows in response to said row control signal based on the address information provided at said set of address terminals, a second external terminal for receiving a second control signal which is externally generated outside the memory circuit, third means responsive to said second external control signal for generating at least one column control signal, fourth means coupled to said set of address terminals, for selecting the columns in response to said column control signal based on the address information provided at said set of address terminal at that time, a third external terminal for receiving a third control signal which is externally generated outside the memory circuit, fifth means responsive to said third external control signal and said second external control signal for operatively generating a write control signal, said fifth means including a first transistor having a control electrode directly connected to said third external terminal and a second transistor having a control electrode connected to said second external terminal, said first transistor being adapted to assume a non-conductive state in response to said third external control signal, said second transistor being adapted to assume a non-conductive state in response to said second extenal signal, said fifth means generating said write control signal only when both of said first and second transistors are non-conducting, and sixth means responsive to said write control signal for performing a write operation for a memory cell selected by said second means and fourth means.

6. The memory circuit according to claim 5, in which said first and second transistors are field effect transistors forming a NOR circuit.

7. A memory circuit comprising, a plurality of memory cells, a column address strobe terminal for directly receiving a column address strobe signal which is externally generated outside the memory circuit, first means responsive to said column address strobe signal for operatively making said memory cells in an accessed state, a write control terminal for directly receiving a write control signal which is externally generated outside the memory circuit, and second means for operatively performing a write operation to the selected memory cell under the accessed state of said memory cells, said second means including a logic gate having a first input terminal directly connected to said column address strobe terminal and a second input terminal connected to said write control terminal, said logic gate generating a write execution signal for achieving a write operation only when both of said column address strobe signal and said write control signal are present.

8. The circuit according to claim 7, in which said logic gate includes a first field effect transistor having a gate directly connected to said first input terminal and a second field effect transistor having a gate connected to said second input terminal.

* * * * *

UNITED STATES PATENT AND TRADEMARK OFFICE
CERTIFICATE OF CORRECTION

PATENT NO. : 4,617,647
DATED : October 14, 1986
INVENTOR(S) : Katsuji HOSHI

It is certified that error appears in the above-identified patent and that said Letters Patent is hereby corrected as shown below:

Column 2, Line 15, delete "putoutput", and insert therefor

--put-output--

Column 2, Line 20, delete "readwrite", and insert therefor

--read-write--

Column 2, Line 38, delete "mode", and insert therefor --node--

Column 3, Line 8, delete "por-" and insert therefor --po---

Column 3, Line 45, delete "$N_{41}$", and insert therefor --N41--

Column 4, Line 9, delete "along", and insert therefor --alone--.

Signed and Sealed this

Twenty-fourth Day of March, 1987

*Attest:*

DONALD J. QUIGG

*Attesting Officer*   *Commissioner of Patents and Trademarks*